United States Patent [19]

Giammarco et al.

[11] Patent Number: 4,595,484

[45] Date of Patent: Jun. 17, 1986

[54] REACTIVE ION ETCHING APPARATUS

[75] Inventors: Nicholas J. Giammarco, Newburgh; George A. Kaplita, New Windsor, both of N.Y.

[73] Assignee: International Business Machines Corporation, Armonk, N.Y.

[21] Appl. No.: 803,190

[22] Filed: Dec. 2, 1985

[51] Int. Cl.[4] ............................................ C23C 15/00
[52] U.S. Cl. .................................... 204/298; 156/345; 156/643; 204/192 R; 204/192 E
[58] Field of Search ............... 204/298, 192 R, 192 E; 156/345, 643

[56]  References Cited

U.S. PATENT DOCUMENTS

| 3,730,873 | 5/1973 | Pompei et al. | 204/192 E |
|---|---|---|---|
| 4,209,357 | 6/1980 | Gorin et al. | 156/345 |
| 4,297,162 | 10/1981 | Munot et al. | 204/298 |
| 4,340,461 | 7/1982 | Hendricks et al. | 204/298 |
| 4,352,974 | 10/1982 | Mizutani | 204/298 |
| 4,364,393 | 4/1981 | Gorin et al. | 204/298 |
| 4,416,759 | 11/1983 | Harra et al. | 204/298 |
| 4,426,274 | 1/1984 | Ephrath | 204/298 |

Primary Examiner—Arthur P. Demers
Attorney, Agent, or Firm—T. Rao Coca

[57] ABSTRACT

Disclosed is a RIE apparatus wherein the anode (maintained at ground potential) is composed of a three-plate configuration and is disposed in parallel relationship with the cathode plate. The top and middle plates of the anode have small gas pump-out holes and are affixed to the chamber walls below the pump-out port to form a high pressure baffle chamber. A gas ring interposed between the top and middle anode plates permits uniform diffusion of etchant species into the reaction volume. The third plate (plasma potential reduction plate -PPRP) of the anode is flexibly attached to the middle plate and contains a large number of large holes compared to those in the top and middle plates. The minimum size of the holes in the PPRP is twice the plasma dark space to permit the plasma formed in the reaction volume below the PPRP to be sustained thereabove, thereby increasing the ratio of the grounded area to the cathode area to which the plasma is exposed. Consequently, the DC potential is increased and the plasma potential decreased resulting in an enlargement of the wafer load window, elimination of black silicon formation, increasing uniformity of etching across the entire cathode surface and better etch selectivity.

20 Claims, 5 Drawing Figures

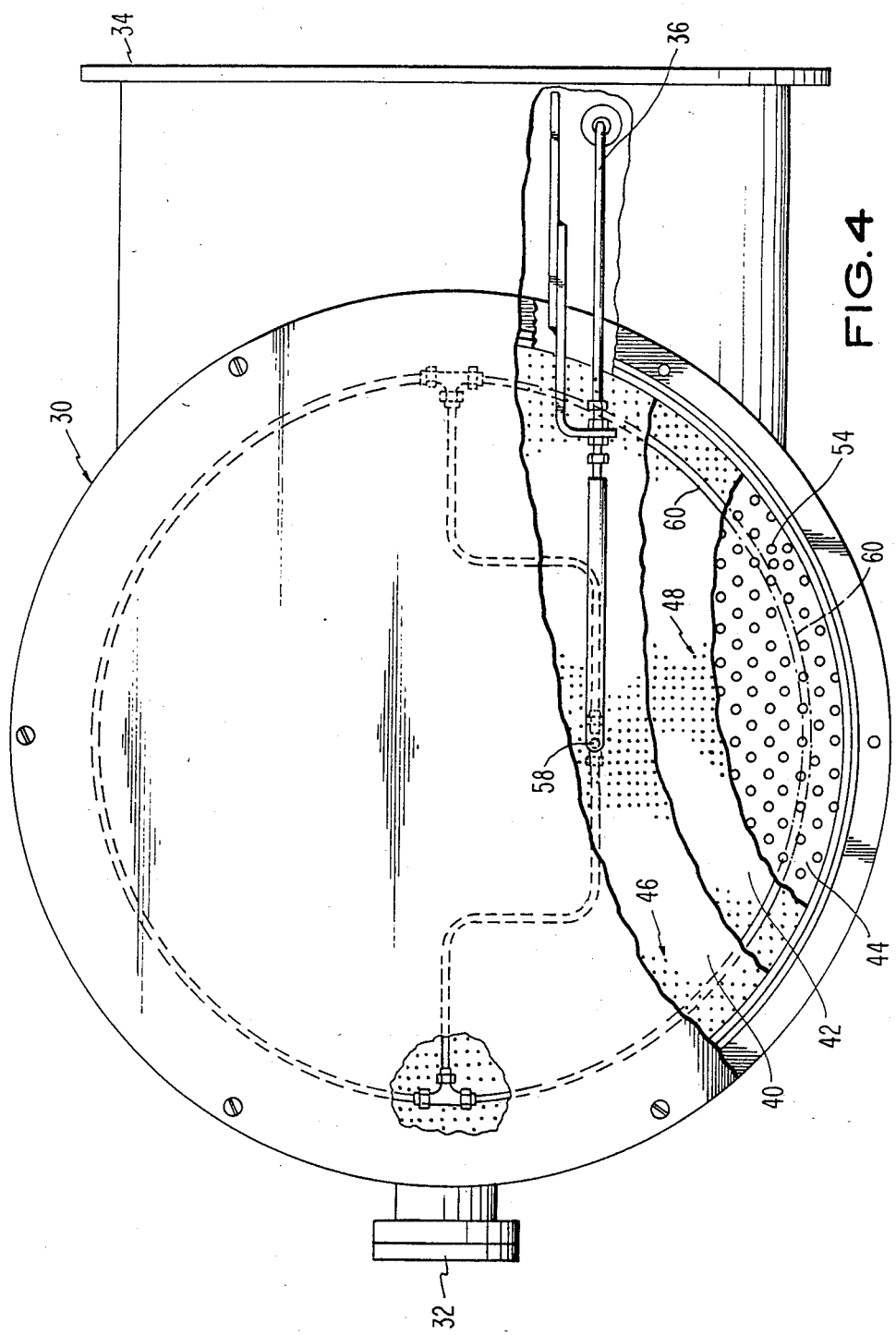

REACTIVE ION ETCHING APPARATUS

BACKGROUND OF THE INVENTION

This invention relates to a reactive ion etching (RIE) apparatus, and more particularly, to a novel anode for such an apparatus for providing uniform and controllable anisotropic etching of workpieces.

In the manufacture of semiconductor devices considerable interest exists in employing dry processing techniques for patterning workpieces such as semiconductor wafers. The interest in dry etching stems from their generally better resolution and improved dimensional and shape control capabilities relative to etching using wet chemicals. Among the dry etching techniques, reactive ion etching has been favored, especially with ultrafine (i.e., submicron dimension) resolution demanded by devices of the very large scale integration (VLSI) and ultra large scale integration (ULSI) type because of its compatibility to achieve high rates and extremely well-defined edges on etched materials.

The requirements for high volume handling of semiconductor wafers has resulted in the use of multiple wafer batch RIE systems. In order to enhance the throughput and to simultaneously process large number of wafers without human intervention the RIE systems have been automated. In an automated RIE system the wafers are automatically transported, loaded, processed and unloaded.

The RIE system (see FIG. 1 and refer for a more complete description to U.S. Pat. No. 4,384,938 issued to Desilets et al and assigned to the present assignee) typically consists of a container 10 wherein are positioned an anode 12 and cathode 14. The cathode is negatively biased relative to the anode and the walls of container 10 by means of a radio frequency (RF) potential. The wafer to be etched is covered by the suitable mask and then placed directly on the cathode 12. A chemically reactive gas such as $CF_4$, $CHF_3$, $CClF_3$ and $SF_6$ either directly or mixed with $O_2$, $N_2$, He, or Ar is introduced via the tube 16 and nozzle 18 into the container 10 maintained at a pressure, typically, in the millitorr range. The anode 12 is provided with gas pump-out holes 20. Pump-out is achieved by permitting the gas to be uniformly pumped through opening 22 in the chamber. The electric field established in the region between the anode 12 and the cathode 14 will dissociate the reactive gas forming a plasma therein. Chemically reactive gas ions in the plasma are accelerated to the cathode and thereby impinge on the surface to be etched. The surface is etched both by chemical interaction with the active ions and by momentum transfer of the ions striking the surface. By virtue of the electric field attracting the ions to the cathode, the ions strike the surface to be etched predominantly in a direction vertical to the surface so that the process produces well-defined vertically etched side walls.

The RIE system has been used for processing a variety of materials including semiconductors such as mono- and poly-crystalline silicon and GaAs, insulators such as $SiO_2$ $Si_3N_4$ and photoresist, metals such as Al, Au, Pt, Cr, Ti, Ta and their alloys and refractory metal silicides. The processing in this context includes patterning layers of one or more of the aforementioned conductive and insulative materials and etching shallow and/or deep straight-walled trenches in semiconductor bodies.

One of the problems of the prior art RIE systems, particularly in the context of etching silicon, is lack of uniformity of etching across the entire cathode diameter. Such nonuniform etching is deleterious to the yield of the semiconductor devices formed on the wafer. Attempts have been made to solve the nonuniform etching problem. U.S. Pat. No. 4,384,938 issued to Desilets et al suggests rendering the internal surfaces of the plasma container free of any apertures, holes, recesses, or the like, having an opening dimension larger than one tenth the thickness of plasma dark space. U.S. Pat. No. 4,230,515 issued to Zajac suggests radially decreasing the spacing between the cathode and the anode wherein the gap between the electrodes is greatest at the center and smallest at the circumference of the electrodes. U.S. Pat. No. 4,340,461 issued to Hendricks et al and assigned to the present assignee suggests employing a plasma enhancing baffle plate conductively coupled to and provided in close proximity to the anode to form a constricted chamber region between the anode and the baffle plate. By providing apertures in the plasma enhancing baffle plate with opening dimensions considerably greater than the plasma Debye length the plasma glow in the region between the baffle plate and the anode is enhanced thereby improving etching uniformity. Despite these prior art improvements the need for better uniformity in etching of wafers dispersed across the cathode plate dimension remains particularly due to the insatiable demands of the microelectronics industry for higher yields, particularly, in conjunction with higher etch selectivity and rate. Moreover, with the trend toward progressively larger wafers and utilization of single wafer RIE etch systems, the microelectronics industry is also demanding extremely high etch uniformity over a single wafer.

A second problem with the prior art RIE systems is generation of contaminants during the etching process. To elaborate on this, the prior art systems when operated at a given applied RF voltage and power invariably give rise to a high plasma potential and a low DC potential (the potential difference between the plasma and the cathode). As a result of the high plasma potential the chamber walls and other metallic, organic and other materials used in the construction of the interior RIE system components will be sputtered off. These sputtered materials deposit on the workpieces deleteriously affecting the yield.

The low DC potential renders the RIE system extremely dependent on wafer loading to provide the desired etching capabilities and the consequent limitation of the process window for etching. Focusing specifically on etching silicon, for a given set of etch parameters the etching process is highly sensitive to the amount of silicon exposed for etching. A slight variation from a pre-adjusted silicon loading has a drastic effect on the etching process. Such a variation produces a voltage shift of a few volts which when the DC voltage is low becomes of significant proportion. In general, the amount of silicon exposed for etching is simply the product of the number of silicon wafers to be etched and the percent of silicon exposed per wafer. Thus, in practice, this necessitates operating the RIE system always with a pre-fixed, exact number of wafers and accurately knowing the percentage of silicon exposed per wafer. This narrow process window is unsuitable for high throughput and precise replication processing of wafers typical of a manufacturing line.

Associated with the limitation on the process window and high plasma potential problems discussed above, specifically in the context of etching deep trenches in silicon, is the black silicon (also known as rough silicon) problem. Black silicon is formation of silicon spikes at the bottom of the trench due to uneven etching of the trench floor. The spikes appear black when viewed under a microscope, hence the terminology. FIG. 2, which is a scanning electron micrograph of a silicon trench formed using the prior art RIE apparatus exemplifies the black silicon formation. Black silicon tends to not only electrically short out adjacent silicon regions separated by the trench, but also give rise to crystalline defects in the subsequently applied dielectric-fill material (such as polysilicon and polyimide) thereby destroying the basic dielectric isolation purpose of the trench.

Accordingly, it is an object of the invention to provide a RIE apparatus which allows an enhanced etch uniformity across a given workpiece.

It is another object of the invention to provide an RIE apparatus which enables excellent etch uniformity across the entire cathode plate.

It is still another object of the invention to provide an RIE apparatus which is free of wafer load dependency.

It is yet another object of the invention to provide an RIE apparatus which is free of black silicon, contamination control and poor etch selectivity problems.

SUMMARY OF THE INVENTION

The above objects and other related objects may be achieved through the use of a novel RIE apparatus herein disclosed. In one illustrated preferred embodiment of the invention, a RIE apparatus is provided wherein the anode, mounted inside and electrically connected to the process chamber directly above the cathode and maintained at ground potential, is of a three plate configuration. The top plate of the anode is affixed to the chamber walls, extends over the entire diameter of the chamber and is basically an exhaust screen having therein a large number of small holes for pumping out reactant and spent gases. Affixed also to the chamber walls in a parallel relationship with, separated from and directly below the top plate is the middle plate, known as the gas uniformity plate. The gas uniformity plate is provided with holes analogous to those in the top plate for the same purpose. Attached, by means of adjustable standoffs, to the gas uniformity plate in a parallel relationship with and close proximity to is the bottom plate, known as the plasma potential reduction plate (PPRP). The PPRP is of substantially the same diameter as the other two plates and is provided with perforations of a size exceeding about twice the plasma dark space. Mounted between the top and middle plates is a gas ring from which etchant gas is introduced into the reaction chamber.

The combination of the top and middle plates and the gas ring facilitate uniform introduction of the etchant gas into the reaction volume between the cathode plate and the PPRP. The plasma generated by the RF potential applied to the cathode in the reaction volume defined by the cathode plate and the PPRP and the chamber wall, by virtue of the uniquely sized perforations in the PPRP, will "cross" the PPRP and simultaneously sustain a plasma on the top of the PPRP as well. Since the plasma is formed both above and below the grounded PPRP, the ratio of the grounded area to the cathode area is increased, thereby increasing the DC voltage and reducing the plasma potential. This increase in DC voltage is such that a variation in silicon loading produces a voltage shift of an insignificant proportion, substantially expanding the process window. By adjusting the spacing between the PPRP and the gas uniformity plate the DC potential can be adjusted to eliminate the black silicon problem. Also, since the anode-cathode spacing is now reduced, the plasma density is increased thereby enhancing anisotropic etching.

BRIEF DESCRIPTION OF THE DRAWINGS

The novel features and elements characteristic of the invention are set forth in the appended claims. The invention itself, however, will be best understood by reference to the detailed description which follows in conjunction with the accompanying drawings, wherein:

FIG. 4 is a top view of the RIE apparatus of FIG. 3 illustrating the perforations in the various plates constituting the anode.

DETAILED DESCRIPTION OF PREFERRED EMBODIMENT

Figure 1:
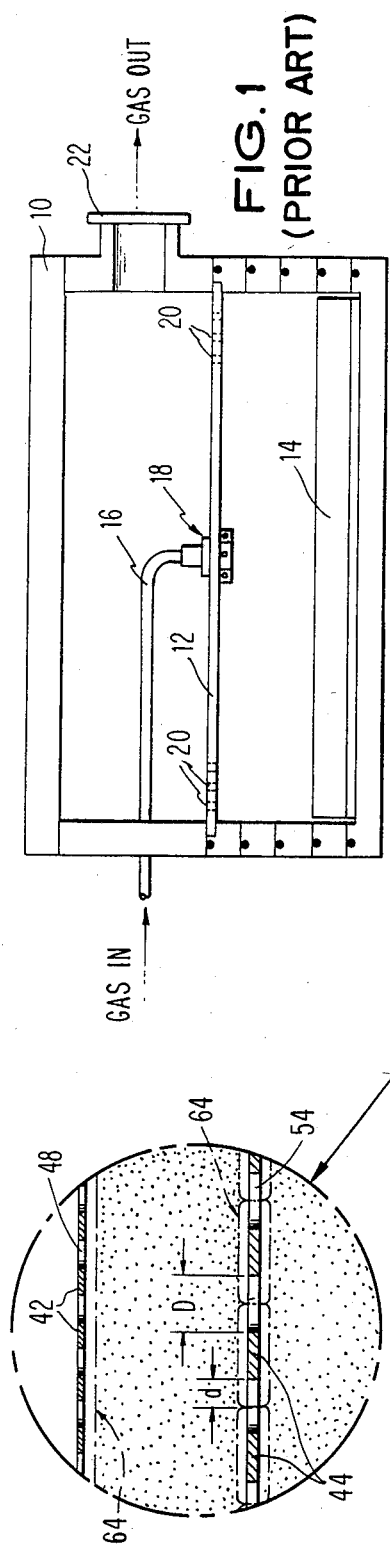
FIG. 1 shows a schematic illustration of a typical prior art RIE apparatus.
Figure 3:
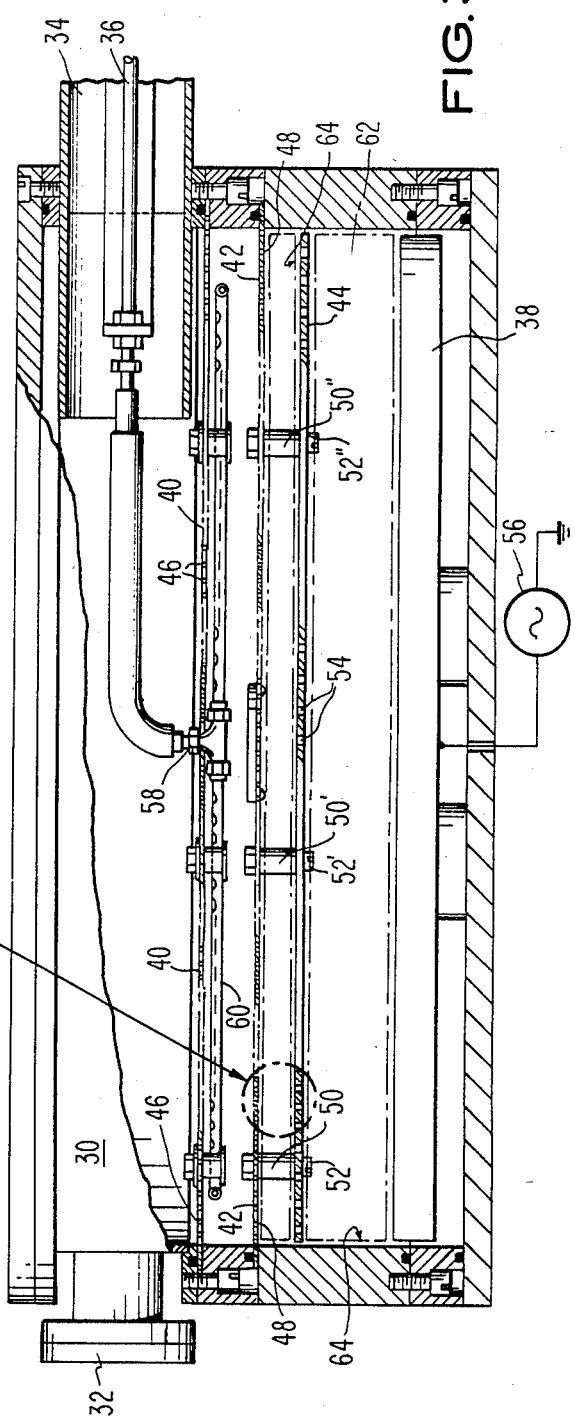
FIG. 3 is a schematic cross-sectional view of a specific illustrative RIE apparatus in accordance with the principles of the present invention.
Figure 2:
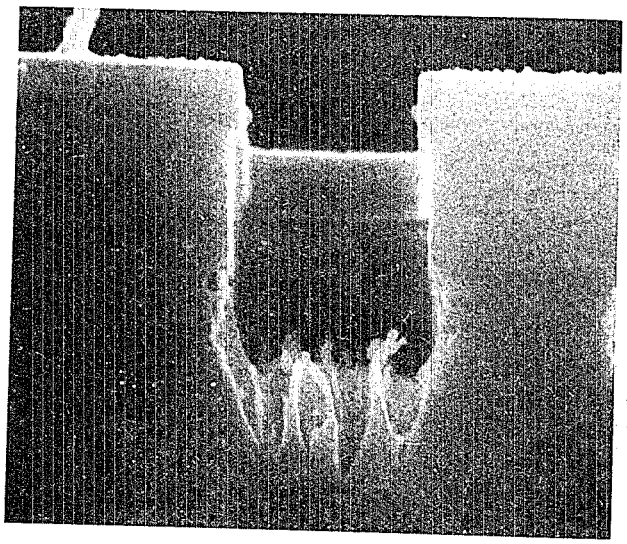
FIG. 2 is a photograph made be scanning electron microscopy of trench formed in silicon using a prior art RIE apparatus exhibiting the black silicon formation.

The specific illustrative apparatus shown in FIGS. 3 and 4 comprises a cylindrical process chamber 30 having a viewing port 32 and an exhaust outlet 34. The chamber 30 is of suitable mechanical construction which permits it to be pumped down to a high vacuum via outlet 34. The process chamber 30 is fitted with a gas inlet port 36 which is connected to a single or multiple sources of various gases which are used in etching for controlled introduction of a process gas into the chamber. Positioned within and insulated from the chamber 30 is a circular cathode plate 38 for receiving thereon the workpieces to be etched. The cathode 38 substantially extends the entire diameter of the process chamber and is preferably a RF electrode made of an electrically conductive material which is not reactive to the etching process. One suitable cathode material is stainless steel.

Mounted inside the process chamber 30 directly above the cathode 38 is the anode comprised of an arrangement of three parallel plates 40-42-44. The top plate 40 is mechanically attached to the process chamber 30 and consists of a large number of small pump-out holes 46 over the entire surface area thereof. The diameter of the holes 46 is typically about 1/32 of an inch. The top plate is essentially an exhaust screen for gases in the reaction chamber. The middle plate 42, termed herein as gas uniformity plate, like the top plate 40, is affixed to the chamber 30 and is provided with a plurality of small holes 48 over the entire plate area. The holes 48 are typically of the same size as those in plate 42. The separation between the top and middle plates 40 and 42, respectively, is large, typically at least in the range of 1-3 inches. The bottom plate 44 of the three-plate anode is substantially of the same diameter as the top and middle plates. The bottom plate 44 is mechanically and electrically coupled to the middle plate 42 via standoffs 50, 50' and 50" so that it is parallel to and close proximity with the plate 42. The spacing between the plates 42 and 44 can be adjusted by means of the screws 52, 52' and 52" to a desirable gap, typically about 0.5–1 inch. Plate 44, also termed herein as plasma potential reduction plate (PPRP), is provided with a series of perforations 54 to enable plasma generated in the reaction volume below the plate 44 to be sustained above this plate. With this in view, the diameter D of the perforations 54 in the PPRP is tailored to be at least about twice the dark space d of the plasma as shown in the blown-up view in FIG. 3. Typically, the diameter of the perforations 54 is $\frac{1}{4}$–$\frac{3}{8}$ of an inch.

Disposed between the top and middle plates 40 and 42, respectively, and connected to the gas inlet port 36 via nozzle 58 is a gas ring 60. The ring 60 is provided along the circumference thereof a series of holes for introducing the etchant gas into the volume between the plates 40 and 42. The volume between plates 40 and 42 serves as a baffle chamber which is maintained at a higher pressure than that in both the reaction volume below the plate 42 and the pumping portion of the chamber 30 above the plate 40, thereby enabling ideal molecular flow conditions. Specifically, this design insures an uniform diffusion of etchant gas species into the reaction volume creating a highly uniform plasma density necessary for etching the workpiece with a high degree of selectivity.

Means is provided for energizing the cathode and anode to produce an electric field for ionizing the gas in chamber 30. This means includes a RF generator 56 which is connected to the cathode 38. In one preferred embodiment, the generator operates at a frequency on the order of 13.56 MHz and delivers a power level on the order of about 400–1000 watts, although other frequencies and power levels can be utilized, if desired.

Having described the salient features of the RIE apparatus of the invention, the operation of the apparatus will now be traced with specific reference to etching deep trenches in silicon wafers. With reference to FIGS. 3 and 4, the wafers to be etched are assembled on the cathode plate 38. A suitable etchant gas such as $CF_4$ is introduced into the reaction volume via the gas inlet port 36, nozzle 58 and ring 60. Oxygen many be used to accelerate the etching process and also prevent accumulation of carbon deposits resulting from chemical interaction of $CF_4$ with the anode, chamber wall, etc. An alternative etchant gas is a mixture of $SF_6$, $Cl_2$ and He. The flow rate and the pumping speed are adjusted such that the etchant gas remains in the process chamber for an optimum period of time to balance the buildup and decline of the active species which are responsible for etching, but not so long that the by products of the reaction seriously inhibit the reaction. Once the necessary low pressure in the millitorr range and flow rate in the range of 30–70 sccm is maintained in the reaction volume 62, RF power supply 56 is turned on to effectively negative-bias the cathode 38 with respect to the anode plate 40-42-44 and the reaction chamber 30, which are maintained at ground potential. Since the anode essentially extends over the entire cathode plate and is spaced in parallel relationship therewith at a predefined, fixed distance, an essentially uniform and intense vertical electric field is established in the reaction volume 62 between these two electrodes. Consequently, positive ions (i.e., $CF_3$ ions) from the reactive plasma are accelerated to the cathode in a vertical direction. Some of these high energy ions will impinge on the silicon wafers to chemically and physically interact to anisotropically etch away areas not covered by a mask. Since the electric field is uniform over the entire cathode plate 38, the etch rate over the entire cathode surface will be uniform and all the etched wafer surfaces will have a common and well-defined vertically etched wall profile.

The novel three-plate anode 40-42-44 significantly enhances the DC potential by reducing the plasma potential thereby expanding the silicon load window and eliminating the black silicon problem. To elaborate on the detailed mechanism responsible for these beneficial results, the interrelationship between the various potentials prevalent in the RIE apparatus should be understood. Designating the plasma potential by Vp, the DC potential responsible for accelerating the ions toward the cathode by Vdc and the peak-to-peak value of the applied RF potential as Vpp, these potentials are interrelated by the expression:

$$Vdc = Vpp/2 - 2Vp$$

For a given value of Vpp, the invention reduces Vp thereby increasing Vdc. The plasma potential Vp is directly proportional to the ratio of the cathode area to grounded area (area of the electrode corresponding to the reaction volume which is at ground potential). The invention significantly increases the grounded area by enabling the plasma generated in the reaction volume 62 and designated in FIG. 3 by numeral 64 to penetrate through each of the perforations 54 in PPRP and be formed above the PPRP as indicated by numeral 64. This penetration or "crossing" of the plasma through the anode PPRP 44 is facilitated by the unique size of the perforations 54 exceeding twice the plasma dark space. Since the plasma is sustained both above and below the grounded PPRP, the total surface area of the electrode maintained at ground potential with which the plasma is in communication is significantly increased, resulting in a corresponding drop in the plasma potential.

Since reduction in Vp translates into a significant increase in Vdc, the present RIE apparatus will have a large process window from a wafer load standpoint. In other words, it is no longer necessary to maintain a common, high silicon load on the cathode to obtain the desired and consistent etching from batch to batch. To illustrate this dramatic enhancement of the process window, reference is made to Table I wherein is compared the applied power and the dependency of the three potentials discussed above as obtained with the prior art apparatus and the apparatus of the present invention. The data in Table I pertains to etching silicon using 100% $CF_4$ gas at a flow rate of 40 sccm and 50 mTorr chamber pressure.

TABLE I

| RIE Apparatus | Power (watts) | Vpp (volts) | Vdc (volts) | Vp (volts) |
|---|---|---|---|---|
| Prior Art* | 450–1000 | 800–1290 | 159–270 | 120–188 |
| Invention | 450–1000 | 760–1110 | 315–504 | 32–35 |

*U.S. Pat. No. 4,384,938

Figure 5:
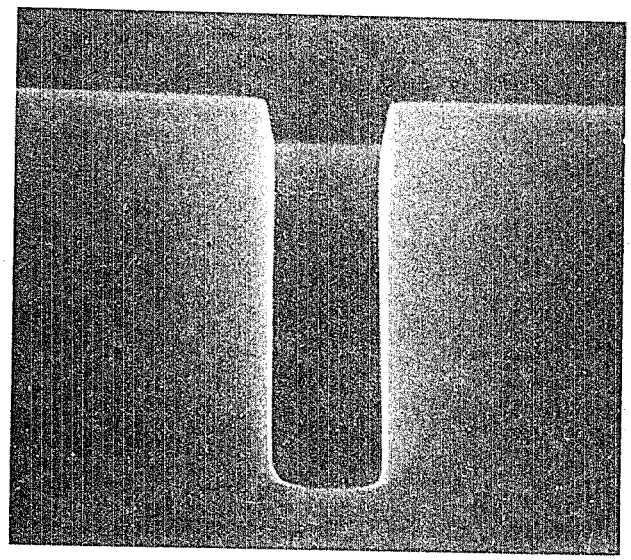
FIG. 5 is a photograph made by scanning electron microscopy of a trench formed in silicon using the apparatus of the present invention.

It is evident from Table I that a significant decrease in plasma potential and increase in DC voltage is obtained by the present RIE apparatus. The increase in DC voltage additionally contributes to better etch selectivity and elimination of black silicon due to generation of more intense electric field in the reaction volume 62. The intense electric field imparts to the ions in the plasma an extremely high momentum which will enable the improved etching. In this context reference is made to FIG. 5 which is a photograph made by scanning electron microscope of a trench in silicon using the apparatus of the invention. It is readily apparent from this photograph that black silicon in the trench is totally eliminated while preserving the high vertical etch anisotropy.

The decrease in plasma potential translates into elimination of the sputtering of the chamber walls and other surfaces which gives rise to introduction of contaminants onto the surfaces of the work pieces during etching. Thus, the three-plate anode configuration simultaneously enhances the wafer load window and eliminates deleterious sputtering of chamber walls and other surfaces within the chamber.

The three-plate anode enables fine tuning the RIE apparatus to optimize a particular etch process window owing to the flexibility of movement of the PPRP 44 relative to the cathode 38. By moving the PPRP relative to the cathode the density of plasma 64 in the reaction volume 62 may be altered. It will be appreciated that plasma density is an important parameter in the etching process.

The materials for constructing the plates of the three-plate anode configuration, in general, include any material conventionally employed for fabrication of RIE system electrodes. Examples of these materials are aluminum and stainless steel.

With reference to the size of the perforations 54 in the anode's PPRP 44, it should be emphasized that the penetration or "crossing" of the plasma through the PPRP 44 is facilitated by the unique size of the perforations 54. The perforations 54 be large enough to sustain a plasma above the PPRP 44 and, consequently, have a diameter of greater than or equal to about twice the plasma dark space thickness. It is also equally important that the perforations 54 be not too large lest plasmoids (i.e. enhanced localized plasma hot spots) anologous to those discussed in the Desilets et al patent which would affect uniformity of etching. Another consideration against rendering the perforations 54 too large is that the larger the size of these perforations, the smaller will be the area of the anode with which the plasma will be in communication. A smaller of such anode area means a smaller grounded area and, therefore, a larger plasma potential and smaller DC voltage.

In summary, the RIE apparatus comprised of a three-plate anode configuration with the bottom plate having therein perforations of a size greater than about twice the plasma dark space, provides: (1) excellent etch uniformity not only across each surface, but also over all wafers mounted on the cathode plate; (2) expands the wafer load window by increasing the DC potential; (3) minimizes deleterious sputtering of the chamber walls and other materials in the chamber by decreasing the plasma potential; (4) enhances the plasma density in the reaction volume by fine tuning the relative separation of the cathode and the anode (PPRP) which, in conjunction with items (2) and (3) above, leads to elimination of black silicon in the context of etching deep trenches in silicon, and; (5) provides a RIE apparatus highly suitable for a large volume manufacturing environment.

Thus, there has been provided, in accordance with the invention, a RIE apparatus that fully satisfies the objects and advantages set forth above.

While the invention has been described in conjunction with a specific preferred embodiment, it is evident that many alternatives, modifications and variations will be apparent to those skilled in the art in light of the foregoing description. While the apparatus has been described in conjunction with a batch RIE apparatus, it is equally applicable to a single wafer RIE apparatus. Likewise, the apparatus is applicable to plasma etching (both high pressure and low pressure). While the apparatus has been described in the context of etching deep silicon trenches, it is adaptable for etching of a variety of materials and patterns by properly selecting reactant gases, power levels, pressures, etc. It is therefore contemplated that the appended claims will embrace any such alternatives, modifications and variations as fall within the true scope and spirit of the invention.

What is claimed is:

1. An etching apparatus comprising:
a vessel;
a cathode plate within said vessel for mounting a workpiece thereon; and
a three-plate anode arranged over said cathode, said anode including upper assembly of spaced-apart first and second perforated parallel plates attached to said vessel and a third perforated plate affixed to said second plate at a predetermined distance below said second plate.

2. The apparatus as in claim 1 wherein the separation between said first and second plates is large compared to that between said second and third plates.

3. The apparatus as in claim 1 wherein the minimum size of the perforations in said third plate is approximately twice the dark space of the plasma generated within said vessel for etching said workpiece.

4. The apparatus as in claim 3 further comprising ring means mounted between said first and second plates for introducing etchant gas into said vessel.

5. The apparatus as in claim 4 wherein said first plate extends over the entire diameter of said vessel.

6. The apparatus as in claim 5 wherein said three plates of the anode are substantially of the same diameter.

7. A reactive ion etching apparatus comprising:
a vessel;
a cathode plate within said vessel for mounting at least one workpiece thereon;
a triple-parallel-plate anode arranged over said cathode and maintained at ground potential, said anode including upper assembly of spaced-apart first and second perforated plates attached to said vessel and a third perforated plate attached to said second plate at an adjustable distance below said second plate.

8. The apparatus as in claim 7 wherein the size of the perforations in said third plate is large compared to the size(s) of the perforations in said first and second plate.

9. The apparatus as in claim 7 further comprising means for introducing etchant gas in the region between said first and second plates.

10. The apparatus as in claim 9 further comprising a pumping port in the wall of said vessel above said anode for exhausting said vessel whereby the region between said first and second plates serves as a high pressure baffle chamber enabling uniform diffusion of the etchant gas into a reaction volume between said third plate and cathode.

11. The apparatus as in claim 10 further comprising means for applying a suitable RF potential to said cathode to generate a plasma in said reaction volume.

12. The apparatus as in claim 11 wherein the perforations in said third plate are of a dimension $\geq$ twice the dark space of said plasma whereby said plasma in said reaction volume is sustained above said third plate and the ratio of the cathode area to the area of the anode with which said plasma is in communication is effectively increased.

13. The apparatus as in claim 9 wherein said gas means is a hollow circular ring having holes along its circumference.

14. The apparatus as in claim 13 wherein the ratio of the separation between the first and second plates to that between the second and third plates is in the range of 2-6.

15. An electrode for an etching apparatus comprising:
a top perforated plate mechanically and electrically attachable to the interior of said apparatus;
a middle perforated plate mechanically and electrically attachable to the interior of said apparatus in a parallel, spaced-apart relationship with said first plate; and
a bottom perforated plate mechanically and electrically attached to said middle plate in a parallel and spaced-apart relationship to said middle plate.

16. The electrode as in claim 15 wherein the size of said holes in the bottom plate is significantly larger than the size(s) of said perforations in the top and middle plates.

17. The electrode as in claim 16 wherein the diameter of the perforations in said bottom plate is at least twice the dark space of the plasma generated in said apparatus during etching.

18. The electrode as in claim 17 wherein said first and second plates are exhaust screens.

19. The electrode as in claim 18 wherein said third plate is fabricated from aluminum or stainless steel.

20. The electrode as in claim 19 wherein said three plates are substantially of the same diameter.

* * * * *